US007031366B2

(12) United States Patent
Gruhlke

(10) Patent No.: US 7,031,366 B2
(45) Date of Patent: Apr. 18, 2006

(54) USING RELAY LENS TO ENHANCE OPTICAL PERFORMANCE OF AN EXTERNAL CAVITY LASER

(75) Inventor: Russell W. Gruhlke, Fort Collins, CO (US)

(73) Assignee: Agilent Technologies, Inc., Palo Alto, CA (US)

( * ) Notice: Subject to any disclaimer, the term of this patent is extended or adjusted under 35 U.S.C. 154(b) by 244 days.

(21) Appl. No.: 10/651,737

(22) Filed: Aug. 29, 2003

(65) Prior Publication Data

US 2005/0047472 A1 Mar. 3, 2005

(51) Int. Cl.
*H01S 3/08* (2006.01)

(52) U.S. Cl. ....................................... 372/101; 372/102

(58) Field of Classification Search ................ 372/101; 356/237.2

See application file for complete search history.

(56) References Cited

U.S. PATENT DOCUMENTS

| | | | | |
|---|---|---|---|---|
| 5,650,877 | A * | 7/1997 | Phillips et al. | 359/726 |
| 6,324,193 | B1 | 11/2001 | Bourzeix et al. | |
| 6,542,179 | B1 * | 4/2003 | Kurtz et al. | 348/97 |
| 6,782,028 | B1 * | 8/2004 | Tsukiji et al. | 372/50.22 |
| 6,879,390 | B1 * | 4/2005 | Kvamme et al. | 356/237.2 |

FOREIGN PATENT DOCUMENTS

| | | |
|---|---|---|
| EP | 02017446 | 8/2002 |

OTHER PUBLICATIONS

"External Cavity Laser in Which Diffractive Focusing is Confined to a Peripheral Portion of a Diffractive Focusing Element," Hoke, et al.

"Method of Enhancing Wavelength Tuning Performance in an External Cavity Laser," Gruhlke, et al.

"Wavelength Tuning an External Cavity Laser Without Mechanical Motion," Gruhlke.

"More on Geometrical Optics," Chapter 6, pp. 226-227; "Diffraction," Chapter 10, pp. 424-430, of "Optics," Second Editiion, Eugene Hecht, copyright 1987, 1974.

"Diffractive optical element used in an external feedback configuration to tune the wavelength of uncoated Fabry-Perot diode lasers," Cassidy, et al., Journal of Modern Optics, 1999, vol. 46, No. 7, 1071-1078.

* cited by examiner

*Primary Examiner*—Minsun Oh Harvey
*Assistant Examiner*—Dung Nguyen

(57) ABSTRACT

A method of enhancing wavelength tuning performance in an external cavity laser includes emitting light into the cavity of the laser at a range of angles relative to an optical axis of the cavity, and transforming emitted light of narrow beam divergence to light with beam divergence wider than the narrow beam divergence. The method further includes diffractively focusing the light of wider beam divergence.

24 Claims, 3 Drawing Sheets

USING RELAY LENS TO ENHANCE OPTICAL PERFORMANCE OF AN EXTERNAL CAVITY LASER

CROSS-REFERENCE TO RELATED APPLICATIONS

This application is related to concurrently filed, co-pending and commonly assigned U.S. patent application Ser. No. 10/651,401, titled "EXTERNAL CAVITY LASER IN WHICH DIFFRACTIVE FOCUSING IS CONFINED TO A PERIPHERAL PORTION OF A DIFFRACTIVE FOCUSING ELEMENT"; concurrently filed, co-pending and commonly assigned U.S. patent application Ser. No. 10/651,747, titled "METHOD OF ENHANCING WAVELENGTH TUNING PERFORMANCE IN AN EXTERNAL CAVITY LASER"; concurrently filed, co-pending and commonly assigned U.S. patent application Ser. No. 10/651,677, titled "WAVELENGTH TUNING AN EXTERNAL CAVITY LASER WITHOUT MECHANICAL MOTION"; and co-pending and commonly assigned European Patent Application No. 02 017 446.2, titled "WAVELENGTH TUNABLE LASER WITH DIFFRACTIVE OPTICAL ELEMENT," filed Aug. 3, 2002, the disclosures of all of which are hereby incorporated herein by reference.

TECHNICAL FIELD

This invention relates to external cavity lasers and particularly to using a relay lens to enhance the optical performance of an external cavity laser.

BACKGROUND OF THE INVENTION

External cavity lasers can exhibit an important advantage of wavelength tuning over large wavelength ranges. An optical gain medium emits light that propagates within the external laser cavity. Wavelength tuning in an external laser cavity depends on the dispersion of light resonating within the cavity. Diffractive focusing elements are incorporated in some external cavity laser designs. In these cases, the dispersion of light either transmitted through or reflected from the diffractive focusing element enables a significant range of wavelength tuning.

Diffractive focusing elements in an external cavity laser are placed either a focal length or two focal lengths from the optical gain medium, e.g., a laser diode, in the case of transmissive and reflective diffractive focusing elements, respectively. Diffractive focusing elements with smaller f number (defined as the focal length divided by diameter) cause larger dispersion, with the largest dispersion occurring at the periphery of the diffractive element. Ideally, light propagating within the cavity exactly fills the diffractive focusing element aperture. However, typical laser diodes emit light with small angular beam divergence. Thus, light incident on a diffractive element of desired small f number, e.g., focal length equal to diameter, may under-fill the aperture of the diffractive element. Under-sampling the highly dispersive diffractive periphery limits the dispersion of light resonating in the cavity. This impairs the laser cavity wavelength tuning performance.

BRIEF SUMMARY OF THE INVENTION

In accordance with the invention, an external cavity laser is provided. The external cavity laser includes an optical relay element operable to transform an emitted light beam of lower beam divergence to a light beam of higher beam divergence, and an optical gain medium capable of emitting the light of lower beam divergence over a range of wavelengths and angles propagating in the cavity of the external cavity laser. The external cavity laser further includes a diffractive focusing element including a central radial portion and a peripheral radial portion The central radial portion has a dispersivity less than a threshold, and the peripheral radial portion has a dispersivity greater than the threshold. The diffractive focusing element is operable to diffractively focus the light beam of higher beam divergence back into the optical gain medium at differing wavelength-dependent focal distances.

In accordance further with the invention, a method of enhancing wavelength tuning performance in an external cavity laser is provided. The method includes emitting light into the cavity of the laser at a range of angles relative to an optical axis of the cavity, and transforming emitted light of narrow beam divergence to light with beam divergence wider than the narrow beam divergence. The method further includes diffractively focusing the light of wider beam divergence.

DETAILED DESCRIPTION OF THE INVENTION

Figure 1:
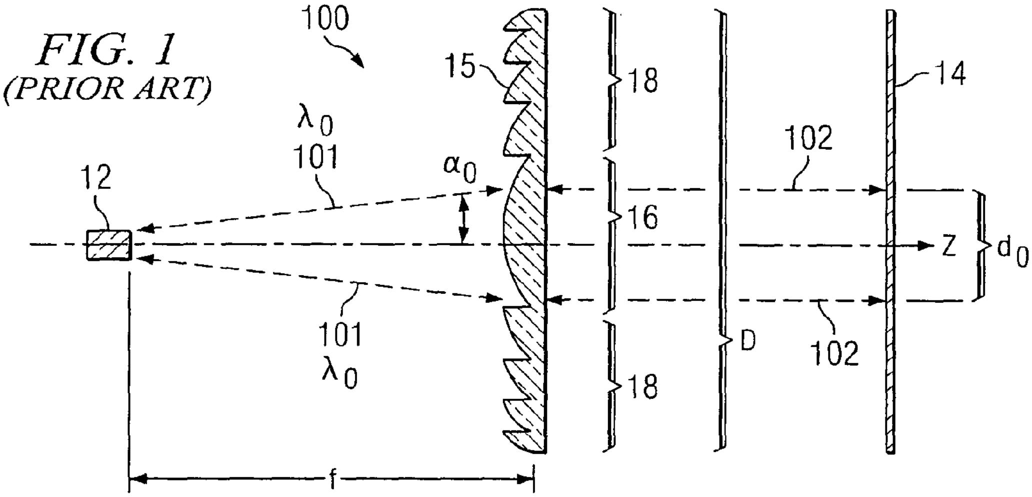
FIG. 1 is a cross-sectional view depicting the geometry of a traditional external cavity laser that utilizes an on-axis, transmissive diffractive focusing element to provide dispersion.

The well-known grating equation (see for example E. Hecht, Optics, Second Edition, Addison-Wesley Publishing Company, 1990, pp. 424–430) can be written:

$$\pm m\lambda_i = \Lambda[\sin\alpha_m - \sin\alpha_i], \quad (1)$$

where $\lambda_i$ is the wavelength of diffracted light, m is the diffractive order, $\Lambda$ is the periodicity of the diffractive profile of the diffractive element, $\alpha_i$ is the angle between the propagation direction of incident light and the normal to the diffractive surface, and $\alpha_m$ is the angle between the diffracted propagation direction and the normal to the diffractive surface. Dispersion, which is defined as the incremental difference in diffracted angle corresponding to an incremental difference in wavelength is given by the expression:

$$\text{Dispersion}=d\alpha_m/d\lambda_i=m/\Lambda\cos\alpha_m. \quad (2)$$

In other words, in any given diffractive order m, dispersion increases with decreasing periodicity $\Lambda$ and with increasing diffracted angle $\alpha_m$.

An external cavity laser includes an optical gain medium capable of emitting light over a range of wavelengths and angles propagating in the cavity of the external cavity laser. Some external cavity lasers incorporate a diffractive focusing element having an axis of symmetry coincident with the optical axis of the optical gain medium. The diffractive focusing element contains a central radial portion and an adjacent complementary peripheral radial portion, and is capable of diffractively focusing the propagating light back into the optical gain medium at differing wavelength-dependent focal distances. The peripheral radial portion of a diffractive focusing element diffracts light with greater dispersion than does the central radial portion of the same diffractive focusing element. Expressed in other words, the central radial portion of a diffractive focusing element has a dispersivity less than a threshold, whereas the peripheral radial portion of the same diffractive focusing element has a dispersivity greater than the same threshold, where dispersivity as defined herein is an optical property of a diffractive element that denotes the capability of the diffractive element to disperse light.

Wavelength tuning in an external laser cavity depends on the dispersion of light resonating within the cavity. Thus, since the peripheral radial portion of a diffractive focusing element has greater dispersivity than does the central radial portion of that element, light diffracted by the peripheral radial portion provides greater effective wavelength tuning performance, whereas light diffracted by the central radial portion undergoes relatively lower dispersion and consequently provides reduced effective wavelength tuning performance of the external cavity laser. In accordance with dispersion equation (2) above, dispersion increases toward the periphery of the diffractive focusing element for two reasons. First, the periodicity of the diffractive surface profile decreases toward the periphery; and second, the diffracted angle of light increases toward the periphery. Since dispersion increases with decreasing periodicity and with increasing diffracted angle, the periphery is the most dispersive portion of the diffractive focusing element. However, for traditional external cavity lasers containing on-axis diffractive focusing elements, most of the light resonating within the cavity is diffractively focused by the central radial portion of the diffractive element, where it undergoes lower dispersion than does light diffractively focused by the peripheral radial portion of the diffractive element.

Adding an optical relay element to the laser cavity further increases the dispersion of light in the cavity. The increased dispersion improves wavelength tuning characteristics and consequently enhances the optical performance of the laser cavity. By placing an optical relay element in the cavity, for example, a low f number diffractive focusing element aperture can be completely filled with light propagating in the cavity. In accordance with dispersion equation (2) above, dispersion is greatest toward the periphery of the diffractive focusing element, because the periodicity of the diffractive surface profile decreases, whereas the diffracted angle increases toward the periphery. By completely filling the diffractive aperture with light propagating in the cavity, the most dispersive portion of the diffractive focusing element, namely the periphery, is sampled. As a result, all of the available cavity dispersion provided by the diffractive focusing element is accessed and, thus, the cavity wavelength tuning performance is enhanced.

FIG. 1 is a cross-sectional view depicting the geometry of a traditional external cavity laser that utilizes an on-axis, transmissive diffractive focusing element to provide dispersion. Optical gain medium 12 emits light beam 101 of wavelength $\lambda_0$ into a cone of half angle $\alpha_0$ about the optical axis (shown as the z-axis in FIG. 1) of external laser cavity 100. Light beam 101 is incident on transmissive diffractive focusing element 15 of overall diameter D, where it fills an aperture of diameter $d_0$, and is transmissively diffractively collimated to form collimated light beam 102 of diameter $d_0$. Transmissive diffractive focusing element 15 includes peripheral radial portion 18 and adjacent central radial portion 16, which has lower dispersivity than does peripheral radial portion 18. Collimated light beam 102 is reflected by principal reflector 14, for example a plane mirror. Reflected light beam 102 then retraces the propagation path of light beams 102 and 101 back through transmissive diffractive focusing element 15 into optical gain medium 12.

In the example shown in FIG. 1, the focal length f of transmissive diffractive focusing element 15 is equal to 5 mm. Furthermore, the diameter of the diffractive element is also equal to 5 mm. Accordingly, the f number (focal length/diameter) of transmissive diffractive focusing element 15 is small and equal to 1. Such a small f number diffractive focusing element can diffract light of differing wavelengths through relatively large angles, potentially providing high dispersion and enhanced wavelength tuning performance. However, in the example of FIG. 1, optical gain medium 12, e.g. a laser diode, emits light beam 101 into a cone with beam divergence half angle $\alpha_0$ of only 12.5 degrees (a typical value). Therefore light beam 101 is diffracted through an angle too narrow to provide high dispersion. To provide collimation, diffractive focusing element 15 must be spaced 5 mm from optical gain medium 12. Over this distance, light beam 101 does not diverge enough to fill the entire diffractive element aperture diameter D as shown in FIG. 1, and consequently is not diffracted by the reduced surface periodicity of peripheral radial portion 18. In fact, only filled aperture diameter $d_0$ confined to central radial portion 16 of diffractive focusing element 15 is sampled by narrow divergence light beam 101. Since central radial portion 16 is the lower dispersivity portion of diffractive focusing element 15, the higher dispersion potential of peripheral radial portion 18 of small f number diffractive focusing element 15 is not utilized, and the resulting wavelength tuning performance of the cavity is consequently impaired. Similar behavior is exhibited in a traditional external cavity laser that utilizes a reflective diffractive focusing element (not shown).

Figure 2A:
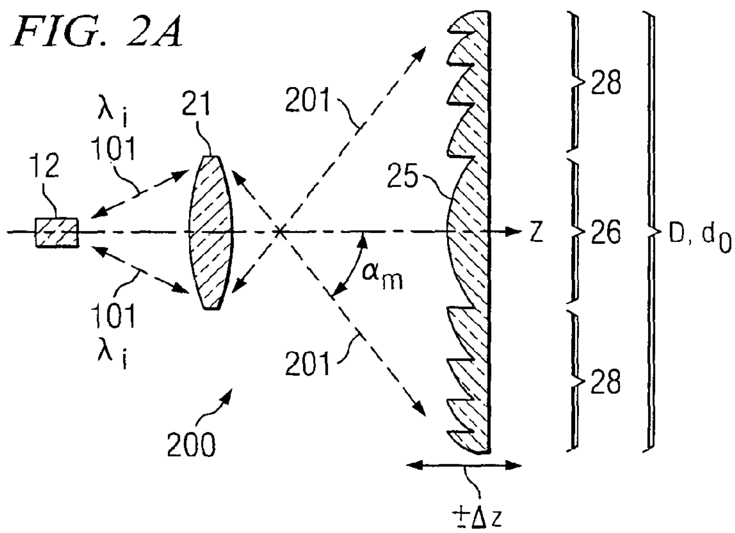
FIGS. 2A–2B are cross-sectional views depicting an optical relay element, for example a relay lens, in external laser cavities that utilize reflective and transmissive on-axis diffractive focusing elements, in accordance with the invention.
Figure 2B:
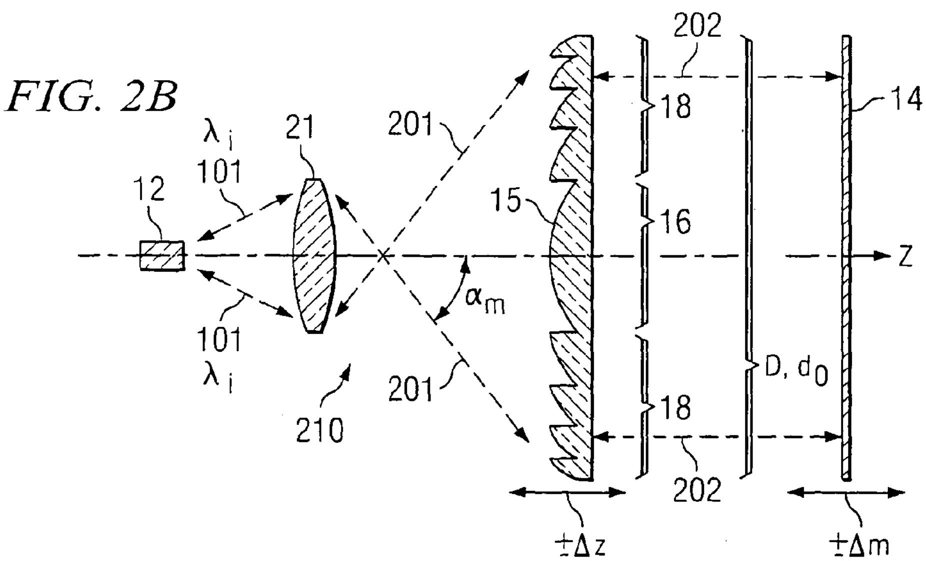

FIGS. 2A and 2B are cross-sectional views depicting an optical relay element, for example relay lens 21, in external laser cavities 200, 210 that utilize reflective and transmissive on-axis diffractive focusing elements 25 and 15, respectively, in accordance with the invention. Relay lens 21 transforms light beam 101 of wavelength $\lambda_i$ and low beam divergence, for example beam divergence half angle $\alpha_0$, emitted from optical gain medium 12 into expanded light beam 201 of beam divergence half angle $\alpha_m$ larger than $\alpha_0$. Expanded light beam 201, when incident on diffractive focusing elements 15, 25, provides larger aperture filling of diffractive focusing elements 15, 25. For example, filled aperture diameter $d_0$ can essentially occupy overall diameter D. As a result, with expanded beam 201, proportionally more light is incident on more dispersive peripheral radial portion 18, 28 relative to central radial portion 16, 26 of diffractive focusing element 15, 25. In accordance with dispersion equation (2) above, dispersion increases toward the periphery of diffractive focusing elements 15, 25 for two reasons. First, the periodicity of the diffractive surface profile decreases toward the periphery; and second, the diffracted angle of light increases toward the periphery. Since dispersion increases with decreasing periodicity and with increasing diffracted angle, peripheral radial portion 18, 28 is the most dispersive portion of diffractive focusing elements 15, 25.

Wavelength tuning in external laser cavity lasers 200, 210 is accomplished traditionally by moving diffractive element 15, 25 axially relative to gain medium 12, as indicated by directional arrows labeled ±Δz in FIGS. 2A–2B (see for example Bourzeis et al., U.S. Pat. No. 6,324,193, issued Nov. 27, 2001; also D. T. Cassidy et al., Modem Optics, Vol. 46, Section 7, 1999, pp. 1071–1078). The diffractive surfaces of diffractive focusing elements 15, 25 are profiled, such that incident light of a particular wavelength at each radial position is directed to a common focal position. However, because of the dispersivity of diffractive focusing elements 15, 25, light of differing wavelengths is focused at different distances axially from respective diffractive element 15, 25. Relative translation of the diffractive focusing element parallel to the z-axis causes diffracted light of varying wavelengths to focus back into gain medium 12 and thereby to selectively resonate within respective external cavity laser 200, 210. Modal tuning in the transmissive geometry external cavity laser 210 can be accomplished by translating primary reflector 14 parallel to the z-axis, as indicated by arrows labeled ±Δm in FIG. 2B.

Light incident on peripheral radial portion 18, 28 is diffracted through larger angles than light diffracted from central radial portion 16, 26 of diffractive focusing elements 15, 25. As a consequence, peripheral radial portion 18, 28 provides higher dispersion and, consequently, enables enhanced wavelength tuning performance relative to central radial portion 16, 26. Furthermore, light incident on peripheral radial portion 18, 28 accesses finer periodicity in the diffractive surface profile, providing higher dispersion. Thus, relay lens 21 positioned appropriately on optical z-axes of external laser cavities 200, 210 provides enhanced wavelength tuning performance.

Figure 3:
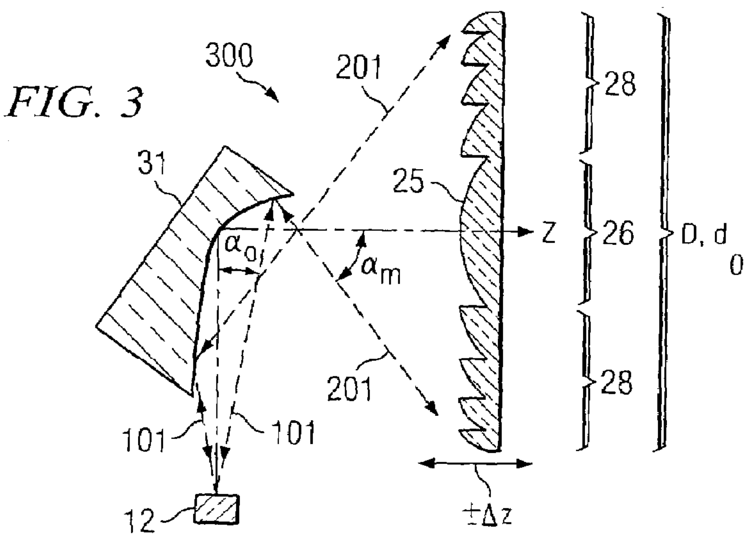
FIG. 3 is a cross-sectional view depicting a reflective geometry external cavity laser including a concave relay reflector 31 as a relay focusing element.

In accordance with the invention, alternatively to refractive relay lens 21, a concave relay reflector may be utilized as a relay focusing element. FIG. 3 is a cross-sectional view depicting reflective geometry external cavity laser 300 including concave relay reflector 31 as a relay focusing element. Optical gain medium 12 emits off-axis light beam 101 into a cone of narrow beam divergence half angle, for example beam divergence half angle $\alpha_0$. Concave relay reflector 31 transforms and axially redirects off-axis light beam 101 into expanded diverging light beam 201 of beam divergence half angle $\alpha_m$ greater than $\alpha_0$. Expanded diverging light beam 201 is then incident on reflective diffractive focusing element 25. Expanded light beam 201 fills an aperture of diameter $d_0$ at diffractive focusing element 25, which can be as large as overall diameter D of diffractive focusing element 25, such that peripheral radial portion 28 in addition to central radial portion 26 is accessed by expanded light beam 201. Diffractive focusing element 25 diffractively reflects expanded light beam 201, which then retraces the original optical path of expanded light beam 201, and is redirected and transformed by concave relay reflector 31 into off-axis light beam 101 with convergence half angle $\alpha_0$ focused back into optical gain medium 12. Traditional techniques are utilized to fabricate concave relay reflector 31 in a manner that minimizes aberrations. External cavity laser 300 is tuned traditionally by translating diffractive focusing element 25 parallel to the z-axis, as indicated by directional arrows labeled ±Δz.

Figure 4:
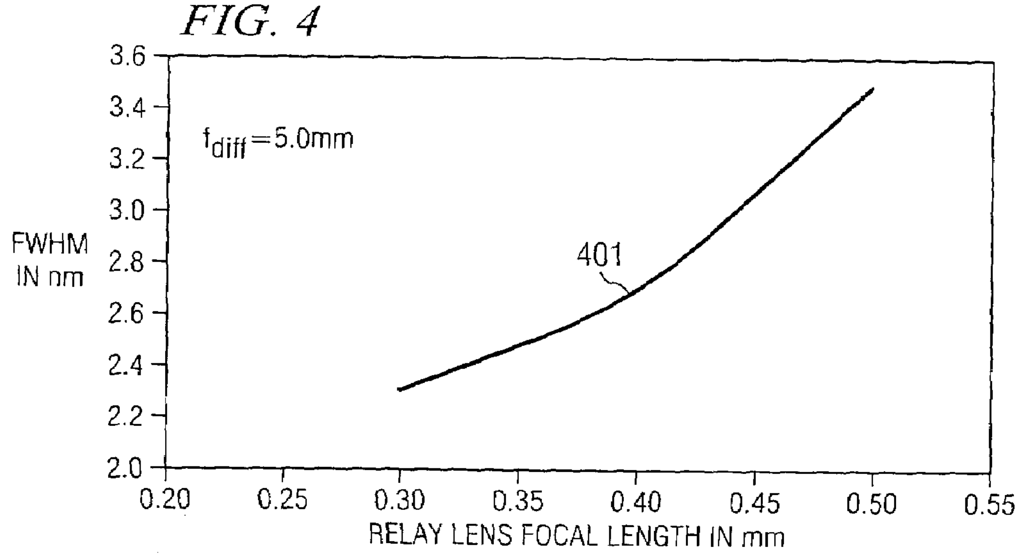
FIG. 4 is a graph showing simulated FWHM in nm as a function of relay lens focal length in mm.

Useful measures of cavity wavelength tuning performance are the cavity spectral and modal responses. Improved wavelength tuning performance is indicated by narrower cavity spectral response and, equivalently, fewer modes propagating efficiently in the cavity. Spectral response is often characterized by the full width of the spectral response at its half maximum (FWHM). FIG. 4 is a graph showing simulated FWHM 401 in nm as a function of relay lens focal length in mm. A shorter focal length increases the angular divergence of the laser light propagating in the laser cavity. Consequently, as the relay lens focal length decreases, diffractive focusing element filling progresses from under-filled to over-filled, accessing finer periodicity in the diffractive surface profile. Moreover, the diffracted angle of light increases, further contributing to higher dispersion. Curve 401 in FIG. 4 shows that cavity spectral response FWHM narrows with decreasing relay lens focal length.

Figure 5:
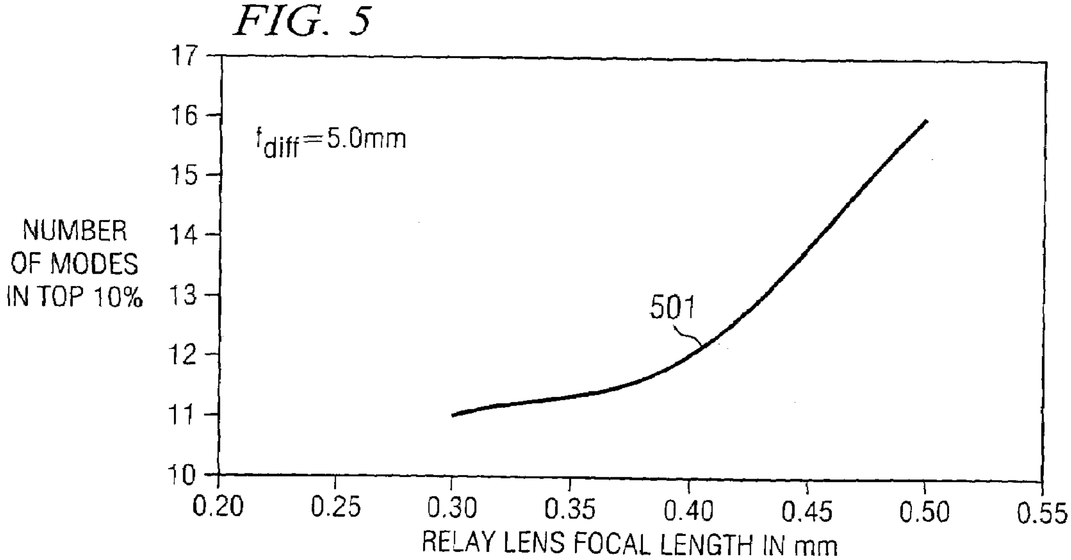
FIG. 5 is a graph showing the number of modes efficiently propagating or competing for resonance in the cavity as a function of relay lens focal length.
Figure 6:
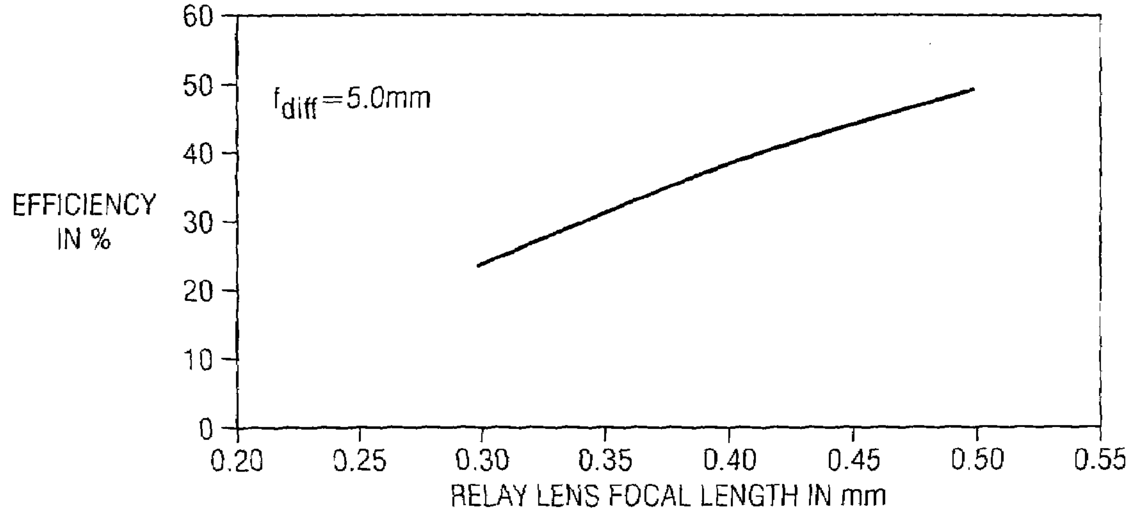
FIG. 6 is a graph showing propagation efficiency as a function of relay lens focal length.

FIG. 5 is a graph showing the number of modes efficiently propagating or competing for resonance in the cavity (the number of modes in the top 10 percent of the cavity modal response) as a function of relay lens focal length, consistent with results shown in FIG. 4 above. As shown in curve 501, the number of modes in the top 10 percent of modal response decreases with decreasing relay lens focal length. The simulated results depicted in both FIGS. 4 and 5 are for reflective diffractive focusing elements with diffractive focal length $f_{diff}$ of 5.0 mm and overall diameter D of 5.0 mm. Reducing the relay lens focal length enhances the wavelength tuning performance of the external cavity laser. FIG. 6 is a graph showing propagation efficiency as a function of relay lens focal length. According to simulated results displayed in FIG. 6, efficiency declines with decreasing relay lens focal length, indicating that the diffractive focusing element aperture is being increasingly overfilled.

Figure 7:
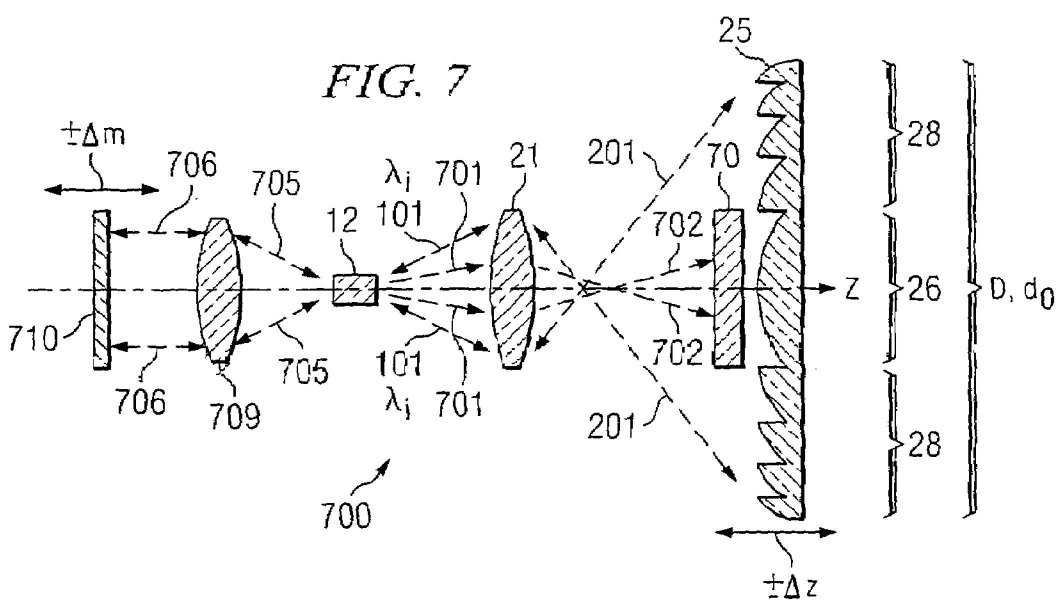
FIG. 7 is a cross-sectional view depicting a technique of modal tuning in a reflective geometry external cavity laser combined with a relay focusing element and an optional central obscuration, in accordance with the invention.

FIG. 7 is a cross-sectional view depicting a technique of modal tuning in reflective geometry external cavity laser 700 combined with a relay focusing element, for example relay lens 21, and with optional central obscuration 70, in accordance with the invention. As depicted in FIG. 2A, relay lens 21 transforms light beam 101 of wavelength $\lambda_i$ and low beam divergence emitted from optical gain medium 12 into expanded light beam 201 of higher beam divergence, which, when incident on reflective diffractive focusing element 25, provides larger aperture filling of reflective diffractive focusing element 25. For example, filled aperture diameter do can essentially cover overall diameter D. As a result, with expanded beam 201, proportionally more light is incident on more dispersive peripheral radial portion 28 of diffractive focusing element 25. In accordance with dispersion equation (2) above, dispersion increases toward the periphery of diffractive focusing element 25 for two reasons. First, the periodicity of the diffractive surface profile decreases toward the periphery; and second, the diffracted angle of light increases toward the periphery. Since dispersion increases with decreasing periodicity and with increasing diffracted angle, peripheral radial portion 28 is the most dispersive portion of diffractive focusing element 25. Consequently, peripheral radial portion 28 provides greater dispersion and therefore enables better wavelength tuning performance than does central radial portion 26.

Unlike transmissive geometry external cavity laser 210 depicted in FIG. 2A, modal tuning cannot be accomplished by translating a primary reflector parallel to the z-axis in reflective geometry external cavity laser 700, which has no primary reflector. Instead, reflective geometry external cavity laser 700 utilizes an alternative technique of modal tuning by adding focusing element 709 and movable tuning reflector 710. Light 101–201 propagating within the cavity of external cavity laser 700 is partially transmitted through optical gain medium 12 as rays 705, which are collimated by focusing element 709 onto tuning reflector 710 as collimated rays 706. After reflection from tuning reflector 710, rays 705–706 retrace their propagation path through optical gain medium 12 into the cavity of external cavity laser 700. Modal tuning in reflective geometry external cavity laser 700 is accomplished by translating tuning reflector 710 parallel to the z-axis, as indicated by the direction arrows labeled ±Δm in FIG. 7.

In accordance with the invention, the wavelength tuning performance of external cavity laser 700 is further optionally enhanced by central obscuration 70, which is described in concurrently filed, co-pending and commonly assigned U.S. patent application Ser. No. 10/651,747, the disclosure of which has been incorporated herein by reference. Central obscuration 70 prevents light propagating in an inner cone, represented by light beams 701–702, from reaching central radial portion 26 of diffractive focusing element 25. Accordingly, light propagating in the inner cone, represented by light beams 701–702, is prevented from being focused back into optical gain medium 12. Thus, diffractive focusing of light, represented in FIG. 7 by light beams 101, 201, back into optical gain medium 12 is confined to higher dispersivity peripheral radial portion 28. This increases the aggregate dispersivity of diffractive focusing element 25 and thereby enhances the wavelength tuning performance of external cavity laser 700. Exposed peripheral radial portion 28 accordingly has a periphery inner diameter equal to the corresponding diameter of central obscuration 70.

Typically, central obscuration 70 can function by directing incident light out of the external cavity, for example by any one or combination of transmission, absorption, reflection, diffraction, or refraction. As described in above-mentioned U.S. patent application Ser. No. 10/651,747, the central obscuration can be positioned on-axis in external cavity laser 700 proximate to central radial portion 26 of diffractive focusing element 25, or can alternatively be fabricated integrally with diffractive focusing element 25. Optionally, central obscuration can be replaced functionally by a central aperture through central radial portion 26 of diffractive focusing element 25, through which transmitted light is directed out of the cavity. In a manner similar to that described above for reflective diffractive focusing element 25, a central obscuration or equivalent aperture can be combined with a transmissive diffractive focusing element, for example transmissive diffractive focusing element 15 depicted in FIG. 2B.

What is claimed is:

1. An external cavity laser comprising:

an optical relay element operable to transform an emitted light beam of lower beam divergence to a light beam of higher beam divergence;

an optical gain medium in the cavity of said external cavity laser, said optical gain medium capable of emitting said light of lower beam divergence over a range of wavelengths and angles; and a diffractive focusing element comprising a central radial portion and a peripheral radial portion, said central radial portion having a dispersivity less than a threshold, said peripheral radial portion having a dispersivity greater than said threshold, said diffractive focusing element operable to diffractively focus said light beam of higher beam divergence back into said optical gain medium at differing wavelength-dependent focal distances;

wherein said optical relay element is disposed optically between said optical gain medium and said diffractive focusing element.

2. The external cavity laser of claim 1 wherein said optical gain medium comprises a diode emitter.

3. The external cavity laser of claim 1 wherein said diffractive focusing element comprises a reflective diffractive focusing element.

4. The external cavity laser of claim 1 wherein said optical relay element comprises a relay lens.

5. The external cavity laser of claim 1 wherein said optical relay element comprises a concave reflector.

6. The external cavity laser of claim 1 wherein said optical relay element is configured to direct said light beam of higher beam divergence to fill said peripheral radial portion.

7. The external cavity laser of claim 6 further comprising means for confining said diffractive focusing of said light beam of higher beam divergence to said peripheral radial portion.

8. The external cavity laser of claim 7 wherein said means for confining comprises a central aperture through said diffractive focusing element.

9. The external cavity laser of claim 7 wherein said means for confining comprises a central obscuration located proximate to said diffractive focusing element.

10. The external cavity laser of claim 9 wherein said central obscuration is disposed optically between said optical relay element and said diffractive focusing element.

11. The external cavity laser of claim 9 wherein said central obscuration is integrally incorporated into said diffractive focusing element.

12. The external cavity laser of claim 1 wherein said optical relay element is further operable to transform said diffractively focused light to light of beam convergence lower than the beam convergence of said diffractively focused light for focusing back into said optical gain medium.

13. The external cavity laser of claim 1 wherein said optical relay element is further operable to direct said diffractively focused light back into said optical gain medium to provide greater separation between said wavelength-dependent focal distances relative to an external cavity laser without said optical relay element.

14. The external cavity laser of claim 1 wherein said diffractive focusing element comprises a transmissive diffractive focusing element.

15. A method of enhancing wavelength tuning performance in an external cavity laser, said method comprising:

emitting light into the cavity of said laser at a range of angles relative to an optical axis of said cavity;

transforming said emitted light of narrow beam divergence to light of beam divergence wider than said narrow beam divergence; and diffractively focusing said light of said wider beam divergence.

16. The method of claim 15 further comprising directing said diffractively focused transformed light back onto said optical axis at wavelength-dependent focal distances.

17. The method of claim 16 wherein said directing said diffractively focused transformed light increases separation between said wavelength-dependent focal distances relative to diffractively focused light without said transforming.

18. The method of claim 16 wherein said directing said diffractively focused transformed light back into said optical gain medium comprises transforming said diffractively focused light of wider beam convergence to a focused beam of convergence narrower than said wider beam convergence.

19. The method of claim 15 wherein said transforming comprises directing said light of wider beam divergence toward a diffractive focusing element.

20. The method of claim 19 wherein said transformed light is diffractively focused with high dispersion.

21. The method of claim 20 further comprising confining said diffractive focusing of said transformed light to a high dispersivity portion of said diffractive focusing element.

22. The method of claim 21 wherein said confining comprises directing a portion of said transformed light out of said cavity through an aperture.

23. The method of claim 21 wherein said confining comprises blocking a portion of said transformed light from undergoing said diffractive focusing.

24. The method of claim 23 comprising blocking said portion of said transformed light integrally with said diffractive focusing element.

* * * * *